United States Patent
Nakamura

(10) Patent No.: US 9,490,155 B2
(45) Date of Patent: Nov. 8, 2016

(54) WAFER PROCESSING METHOD USING ADHESIVE LAYER UV CURING STEP AND LASER MODIFIED LAYER FORMING STEP TO SINGULATE INDIVIDUAL DEVICE CHIPS

(71) Applicant: DISCO CORPORATION, Tokyo (JP)

(72) Inventor: Masaru Nakamura, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 14/967,985

(22) Filed: Dec. 14, 2015

(65) Prior Publication Data

US 2016/0181141 A1    Jun. 23, 2016

(30) Foreign Application Priority Data

Dec. 19, 2014    (JP) .................................. 2014-257621

(51) Int. Cl.
   *H01L 21/683*    (2006.01)
   *H01L 21/78*    (2006.01)

(52) U.S. Cl.
   CPC ........... *H01L 21/6836* (2013.01); *H01L 21/78* (2013.01)

(58) Field of Classification Search
   None
   See application file for complete search history.

(56) References Cited

U.S. PATENT DOCUMENTS

| | | | | |
|---|---|---|---|---|
| 7,179,721 B2* | 2/2007 | Nagai | ............... | B23K 26/0057 257/E21.599 |
| 2009/0124063 A1* | 5/2009 | Nakamura | ........... | B23K 26/009 438/463 |
| 2012/0196426 A1* | 8/2012 | Lim | ..................... | B28D 5/0011 438/460 |
| 2013/0244400 A1* | 9/2013 | George | ............... | H01L 21/0201 438/458 |
| 2014/0318697 A1* | 10/2014 | Tan | ....................... | H01L 21/673 156/247 |

FOREIGN PATENT DOCUMENTS

| | | |
|---|---|---|
| JP | 2004-160493 | 6/2004 |
| JP | 2005-223282 | 8/2005 |
| JP | 2013-165229 | 8/2013 |

* cited by examiner

*Primary Examiner* — Michael Jung
(74) *Attorney, Agent, or Firm* — Greer Burns & Crain, Ltd.

(57) ABSTRACT

A wafer processing method including a modified layer forming step of applying a laser beam having a transmission wavelength to the wafer along each division line to thereby form a modified layer inside the wafer along each division line, and a back grinding step of grinding the back side of the wafer to reduce the thickness of the wafer to a predetermined thickness and also divide the wafer along each division line where the modified layer is formed as a break start point, thereby obtaining individual device chips. Prior to performing the back grinding step, the method further includes a protective tape attaching step of attaching a protective tape to the front side of the wafer, the protective tape having an adhesive layer curable by the application of ultraviolet light, and an adhesive layer curing step of applying ultraviolet light to the protective tape to thereby cure the adhesive layer.

2 Claims, 5 Drawing Sheets

WAFER PROCESSING METHOD USING ADHESIVE LAYER UV CURING STEP AND LASER MODIFIED LAYER FORMING STEP TO SINGULATE INDIVIDUAL DEVICE CHIPS

BACKGROUND OF THE INVENTION

1. Field of the Invention

The present invention relates to a wafer processing method for dividing a wafer along a plurality of crossing division lines, the division lines being formed on the front side of the wafer to thereby define a plurality of separate regions where a plurality of devices are formed.

2. Description of the Related Art

In a semiconductor device fabrication process, a plurality of crossing division lines are formed on the front side of a substantially disk-shaped semiconductor wafer to thereby define a plurality of separate regions, and a plurality of devices, such as ICs and LSIs, are formed in the respective separate regions. The semiconductor wafer is cut along the division lines to thereby divide these separate regions where the devices are formed from each other, thus producing a plurality of individual device chips.

Cutting of such a semiconductor wafer along the division lines is usually performed by using a cutting apparatus called dicing saw. This cutting apparatus includes a chuck table for holding a workpiece such as a semiconductor wafer and an optical device wafer, cutting means for cutting the workpiece held on the chuck table, and moving means for relatively moving the chuck table and the cutting means. The cutting means includes a spindle unit having a spindle, a cutting blade mounted on the spindle, and a motor for rotationally driving the spindle. The cutting blade is composed of a disk-shaped base and an annular cutting edge mounted on one side surface of the base along the outer circumference thereof. The cutting edge is an electroformed diamond blade formed by bonding diamond abrasive grains having a grain size of about 3 µm, for example. The cutting edge has a thickness of about 20 µm, for example.

Since the cutting edge of the cutting blade has a thickness of about 20 µm as mentioned above, each division line for separating the devices must have a width of about 50 µm. Accordingly, the ratio of the area of the division lines to the area of the wafer is large to cause a reduction in productivity.

As another method of dividing a wafer such as a semiconductor wafer, a laser processing method called internal processing has also been put to practical use in recent years. This laser processing method uses a pulsed laser beam having a transmission wavelength to the wafer, wherein the pulsed laser beam is applied to the wafer in the condition where the focal point of the pulsed laser beam is set inside the wafer in a subject area to be divided. That is, the wafer dividing method using this laser processing method called internal processing includes the steps of applying a pulsed laser beam having a transmission wavelength to the wafer from one side of the wafer in the condition where the focal point of the pulsed laser beam is set inside the wafer, thereby continuously forming a modified layer inside the wafer along each division line, and next applying an external force to the wafer along each division line where the modified layer is formed to be reduced in strength, thereby breaking the wafer along each division line (see Japanese Patent Laid-open No. 2004-160493, for example).

As a method of applying an external force to the wafer along each division line where the modified layer is formed, thereby dividing the wafer into the individual device chips, there is disclosed in Japanese Patent Laid-open No. 2005-223282 a technique of attaching the wafer to a dicing tape supported to an annular frame and expanding the dicing tape to thereby apply a tensile force to the wafer, thereby dividing the wafer into the individual device chips along each division line where the modified layer is formed to be reduced in strength.

As another method of applying an external force to the wafer to thereby divide the wafer into the individual device chips, there is disclosed in Japanese Patent Laid-open No. 2013-165229 a technique of attaching a protective tape to the front side of the wafer in which the modified layer is continuously formed along each division line, holding the wafer through the protective tape on a chuck table, and grinding the back side of the wafer as supplying grinding water to thereby reduce the thickness of the wafer to a predetermined thickness and also divide the wafer into the individual device chips along each division line.

SUMMARY OF THE INVENTION

However, in the case of attaching a protective tape to the front side of the wafer in which the modified layer is continuously formed along each division line, holding the wafer through the protective tape on a chuck table, and grinding the back side of the wafer as supplying grinding water to thereby reduce the thickness of the wafer to a predetermined thickness and also divide the wafer into the individual device chips along each division line, there arises a problem such that the device chips obtained by dividing the wafer may come into contact with each other to cause fine chipping of the side surfaces of the device chips, resulting in a reduction in quality of the device chips.

It is therefore an object of the present invention to provide a wafer processing method which can avoid the chipping of the side surfaces of the device chips and also avoid the chipping of the outer circumference of the wafer in the case of attaching a protective tape to the front side of the wafer in which the modified layer is formed along each division line, holding the wafer through the protective tape on a chuck table, and grinding the back side of the wafer as supplying grinding water to thereby reduce the thickness of the wafer to a predetermined thickness and also divide the wafer into the individual device chips along each division line.

In accordance with an aspect of the present invention, there is provided a wafer processing method for dividing a wafer into a plurality of individual device chips along a plurality of crossing division lines, the division lines being formed on the front side of the wafer to thereby define a plurality of separate regions where a plurality of devices corresponding to the device chips are formed, the front side of the wafer being composed of a device area where the devices are formed and a peripheral marginal area surrounding the device area, the wafer processing method including a protective tape attaching step of attaching a protective tape to the front side of the wafer, the protective tape having an adhesive layer curable by the application of ultraviolet light; an adhesive layer curing step of applying ultraviolet light to the protective tape attached to the front side of the wafer to thereby cure the adhesive layer; a modified layer forming step of applying a laser beam having a transmission wavelength to the wafer along each division line in the condition where the focal point of the laser beam is set inside the wafer to thereby form a modified layer inside the wafer along each division line; and a back grinding step of grinding the back side of the wafer as supplying grinding water to reduce the thickness of the wafer to a predetermined thickness and also divide the wafer along each division line where the modified layer is formed as a break start point, thereby obtaining the individual device chips after performing the adhesive layer curing step and the modified layer forming step.

Preferably, the adhesive layer curing step includes the step of applying ultraviolet light to only a central area of the protective tape corresponding to the device area of the wafer, thereby curing only a portion of the adhesive layer in the central area of the protective tape corresponding to the device area of the wafer.

As described above, the wafer processing method of the present invention includes the protective tape attaching step of attaching the protective tape to the front side of the wafer, the protective tape having the adhesive layer curable by the application of ultraviolet light, and the adhesive layer curing step of applying ultraviolet light to the protective tape attached to the front side of the wafer to thereby cure the adhesive layer, wherein the protective tape attaching step and the adhesive layer curing step are performed before performing the back grinding step. Accordingly, even when the wafer is divided into the individual device chips in the back grinding step, the individual device chips are kept in position by the adhesive layer cured, so that there is no possibility that the individual device chips may come into contact with each other to cause the chipping of the side surfaces of the device chips.

Further, in the case that ultraviolet light is applied to only the central area of the protective tape corresponding to the device area of the wafer to thereby cure only a portion of the adhesive layer in the central area of the protective tape corresponding to the device area of the wafer in the above adhesive layer curing step, the remaining portion of the adhesive layer in the peripheral area of the protective tape corresponding to the peripheral marginal area of the wafer is not cured to maintain its adhesive strength. Accordingly, this remaining portion of the adhesive layer tightly adheres to the front side of the wafer, so that there is no possibility that chipping may occur at the outer circumference of the wafer and the front side of the wafer may be contaminated.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
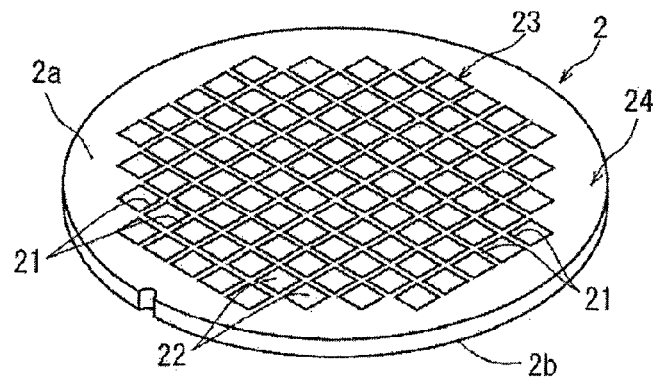
FIG. 1 is a perspective view of a semiconductor wafer.

A preferred embodiment of the wafer processing method according to the present invention will now be described in detail with reference to the attached drawings. FIG. 1 is a perspective view of a semiconductor wafer 2 to be processed according to the present invention. The semiconductor wafer 2 is formed from a silicon wafer having a thickness of 500 μm, for example. The semiconductor wafer 2 has a front side 2a and a back side 2b. A plurality of crossing division lines 21 are formed on the front side 2a of the semiconductor wafer 2 to thereby define a plurality of separate regions where a plurality of devices 22, such as ICs and LSIs, are formed. The semiconductor wafer 2 has a device area 23 where the devices 22 are formed and a peripheral marginal area 24 surrounding the device area 23. There will now be described a wafer processing method for dividing the semiconductor wafer 2 along the division lines 21 to obtain a plurality of individual device chips corresponding to the plural devices 22.

Figure 2A:
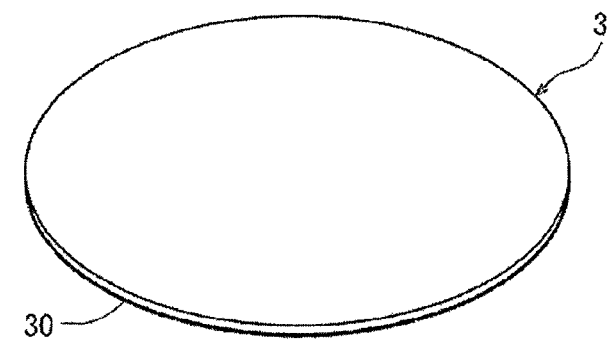
FIGS. 2A and 2B are perspective views for illustrating a protective tape attaching step.
Figure 2A:
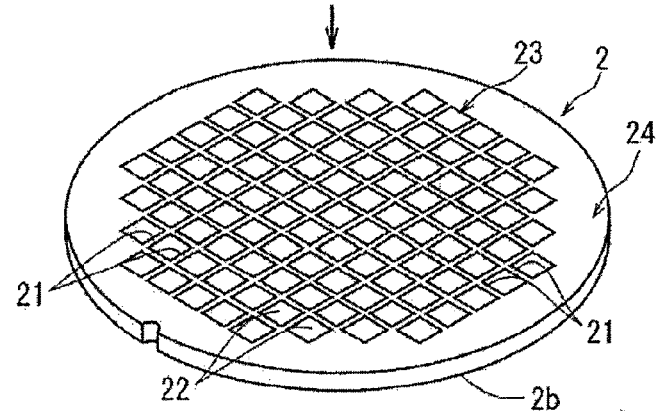
Figure 2B:
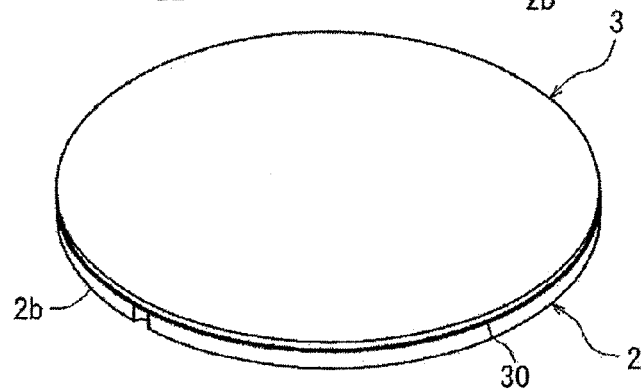

First, a protective tape attaching step is performed in such a manner that a protective tape having an adhesive layer curable by the application of ultraviolet light is attached to the front side 2a of the semiconductor wafer 2. More specifically, as shown in FIGS. 2A and 2B, a protective tape 3 having an adhesive layer 30 curable by the application of ultraviolet light is attached to the front side 2a of the semiconductor wafer 2. In this preferred embodiment, the protective tape 3 is composed of a base sheet and the adhesive layer 30 formed on the front side of the base sheet. This base sheet is formed of polyvinyl chloride (PVC) and has a thickness of 100 μm. The adhesive layer 30 has a thickness of about 5 μm.

Figure 3A:
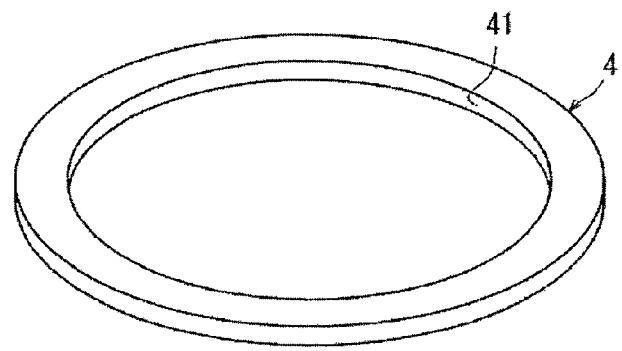
FIGS. 3A to 3C are views for illustrating an adhesive layer curing step.
Figure 3B:
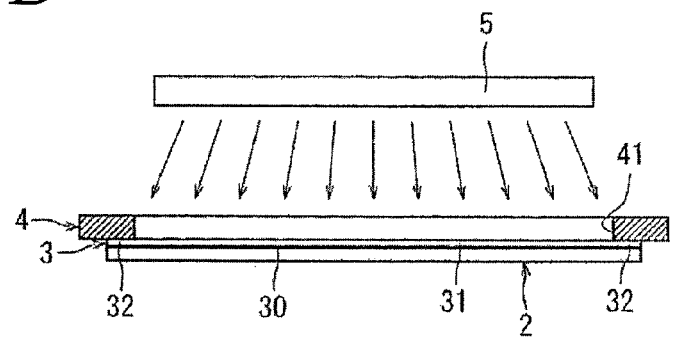

After performing the protective tape attaching step mentioned above, an adhesive layer curing step is performed in such a manner that ultraviolet light is applied to the protective tape 3 attached to the front side 2a of the semiconductor wafer 2 to thereby cure the adhesive layer 30. This adhesive layer curing step will now be described with reference to FIGS. 3A to 3C. In the adhesive layer curing step shown in FIGS. 3A to 3C, an annular mask 4 shown in FIG. 3A is used. The annular mask 4 has an outer diameter larger than the outer diameter of the semiconductor wafer 2. The annular mask 4 is formed with a central circular opening 41 having a size (diameter) corresponding to the size of the device area 23 (see FIG. 1) of the semiconductor wafer 2. As shown in FIG. 3B, the annular mask 4 is placed on the front side (upper surface) of the protective tape 3 attached to the front side 2a of the semiconductor wafer 2. At this time, the circular opening 41 of the mask 4 is aligned with a central area 31 of the protective tape 3 corresponding to the device area 23 of the semiconductor wafer 2. Accordingly, a peripheral area 32 of the protective tape 3 corresponding to the peripheral marginal area 24 of the semiconductor wafer 2 is covered with the peripheral portion of the mask 4. The width L (see FIG. 3C) of the peripheral area 32 of the protective tape 3 corresponding to the peripheral marginal area 24 of the semiconductor wafer 2 is set to 2 to 3 mm, depending upon the kind of the wafer.

Figure 3C:
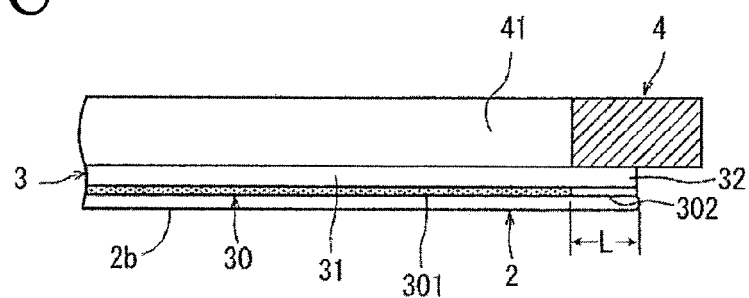

After mounting the mask 4 on the protective tape 3 in the condition where the circular opening 41 of the mask 4 is aligned with the central area 31 of the protective tape 3 corresponding to the device area 23 of the semiconductor wafer 2 as mentioned above, an ultraviolet light applying unit 5 is operated to apply ultraviolet light through the circular opening 41 of the mask 4 to the central area 31 of the protective tape 3 corresponding to the device area 23 of the semiconductor wafer 2 as shown in FIG. 3B. As a result, a portion 301 of the adhesive layer 30 in the central area 31 of the protective tape 3 corresponding to the device area 23 of the semiconductor wafer 2 is cured to be reduced in adhesive strength by the ultraviolet light applied as shown in FIG. 3C. On the other hand, the ultraviolet light is not applied to the peripheral area 32 of the protective tape 3 corresponding to the peripheral marginal area 24 of the semiconductor wafer 2. That is, the ultraviolet light applied from the ultraviolet light applying unit 5 is blocked by the mask 4 covering the peripheral area 32 of the protective tape 3. Accordingly, a portion 302 of the adhesive layer 30 in the peripheral area 32 of the protective tape 3 is not cured, but maintains its adhesive strength.

The protective tape attaching step may be performed before performing a back grinding step to be hereinafter described. The adhesive layer curing step may be performed before performing a modified layer forming step to be hereinafter described or before performing the back grinding step. In the adhesive layer curing step, ultraviolet light may be applied to the whole upper surface of the protective tape 3 without using the mask 4 to thereby cure the whole of the adhesive layer 30.

After performing the adhesive layer curing step mentioned above, a modified layer forming step is performed in such a manner that a laser beam having a transmission wavelength to the semiconductor wafer 2 is applied along each division line 21 in the condition where the focal point of the laser beam is set inside the semiconductor wafer 2 to thereby form a modified layer inside the semiconductor wafer 2 along each division line 21. This modified layer forming step is performed by using a laser processing apparatus 6 shown in FIG. 4. The laser processing apparatus 6 shown in FIG. 4 includes a chuck table 61 for holding a workpiece, laser beam applying means 62 for applying a laser beam to the workpiece held on the chuck table 61, and imaging means 63 for imaging the workpiece held on the chuck table 61. The chuck table 61 has an upper surface as a holding surface for holding the workpiece under suction. The chuck table 61 is movable both in a feeding direction shown by an arrow X in FIG. 4 by feeding means (not shown) and in an indexing direction shown by an arrow Y in FIG. 4 by indexing means (not shown). The feeding means and the indexing means constitute a moving mechanism for moving the chuck table 61 in an XY plane.

The laser beam applying means 62 includes a cylindrical casing 621 extending in a substantially horizontal direction and focusing means 622 mounted on the front end of the casing 621 for applying a pulsed laser beam to the workpiece. The imaging means 63 is mounted on the front end portion of the casing 621 of the laser beam applying means 62. The imaging means 63 includes an ordinary imaging device, such as CCD, for imaging the workpiece by using visible light, infrared light applying means for applying infrared light to the workpiece, an optical system for capturing the infrared light applied to the workpiece by the infrared light applying means, and an infrared imaging device for outputting an electrical signal corresponding to the infrared light captured by the optical system. An image signal output from the imaging means 63 is transmitted to control means (not shown).

Figure 4:
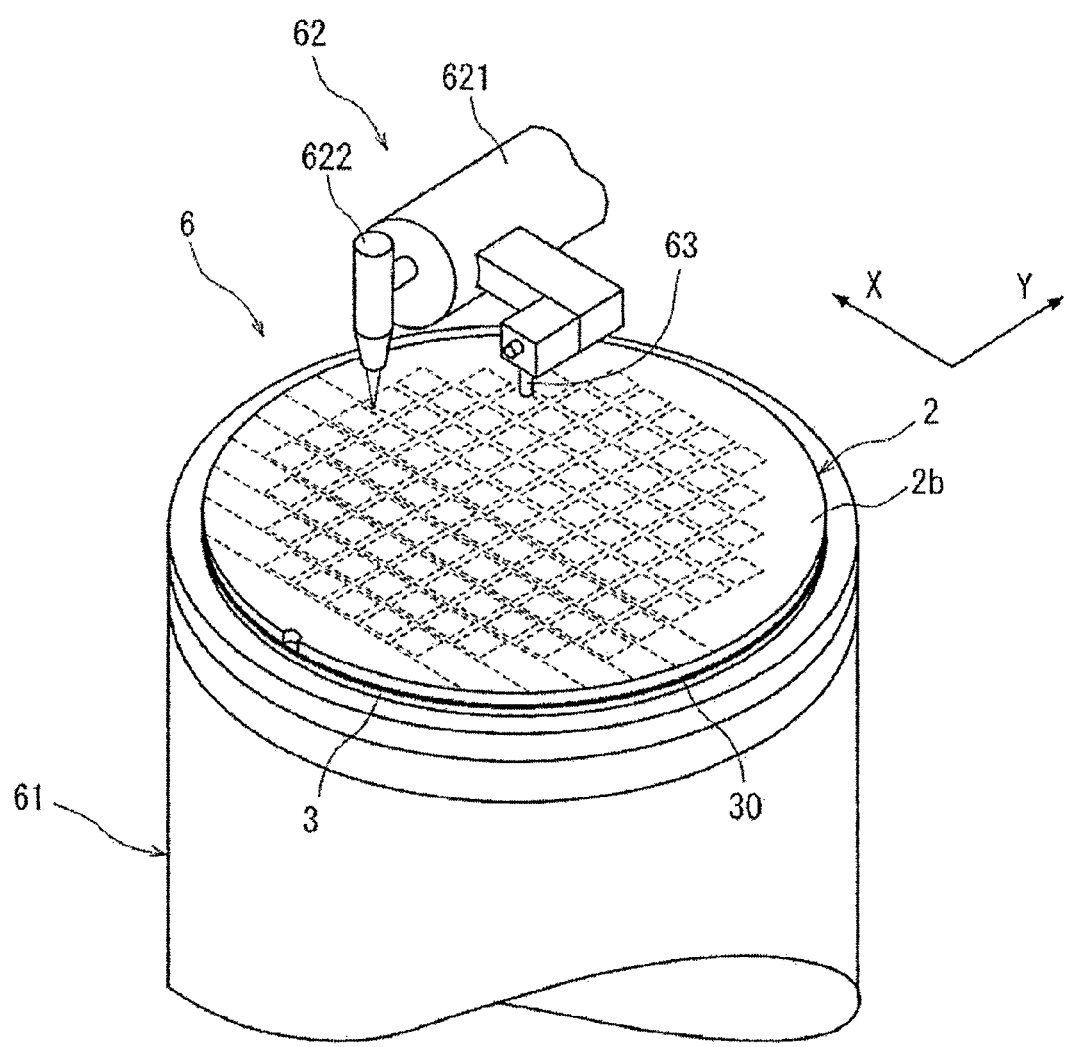
FIG. 4 is a perspective view of an essential part of a laser processing apparatus for performing a modified layer forming step.

The modified layer forming step using the laser processing apparatus 6 will now be described with reference to FIG. 4 and FIGS. 5A and 5B. First, the semiconductor wafer 2 with the protective tape 3 is placed on the chuck table 61 of the laser processing apparatus 6 shown in FIG. 4 in the condition where the protective tape 3 attached to the front side 2a of the semiconductor wafer 2 is in contact with the upper surface of the chuck table 61. Thereafter, suction means (not shown) is operated to hold the semiconductor wafer 2 through the protective tape 3 on the chuck table 61 under suction (wafer holding step). Accordingly, the back side 2b of the semiconductor wafer 2 held on the chuck table 61 is oriented upward. Thereafter, the chuck table 61 holding the semiconductor wafer 2 is moved to a position directly below the imaging means 63 by operating the feeding means (not shown).

In the condition where the chuck table 61 is positioned directly below the imaging means 63, an alignment operation is performed by the imaging means 63 and the control means (not shown) to detect a subject area of the semiconductor wafer 2 to be laser-processed. More specifically, the imaging means 63 and the control means perform image processing, such as pattern matching, for making the alignment between the division lines 21 extending in a first direction on the semiconductor wafer 2 and the focusing means 622 of the laser beam applying means 62 for applying the laser beam to the wafer 2 along the division lines 21, thus performing the alignment of a laser beam applying position. Similarly, this alignment operation is performed for the other division lines 21 extending in a second direction perpendicular to the first direction on the semiconductor wafer 2. Although the front side 2a of the semiconductor wafer 2 on which the division lines 21 are formed is oriented downward, the division lines 21 can be imaged through the semiconductor wafer 2 from the back side 2b thereof because the imaging means 63 includes the infrared light applying means for applying infrared light to the wafer 2, the optical system for capturing the infrared light applied to the wafer 2, and the infrared imaging device for outputting an electrical signal corresponding to the infrared light captured by the optical system as described above.

Figure 5A:
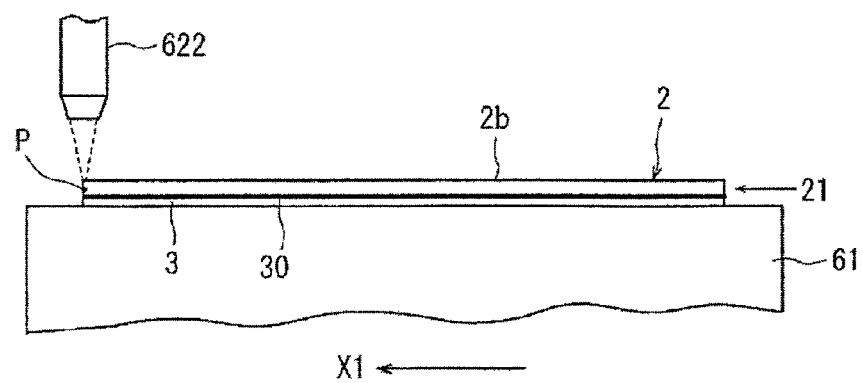
FIGS. 5A and 5B are sectional side views for illustrating the modified layer forming step.
Figure 5B:
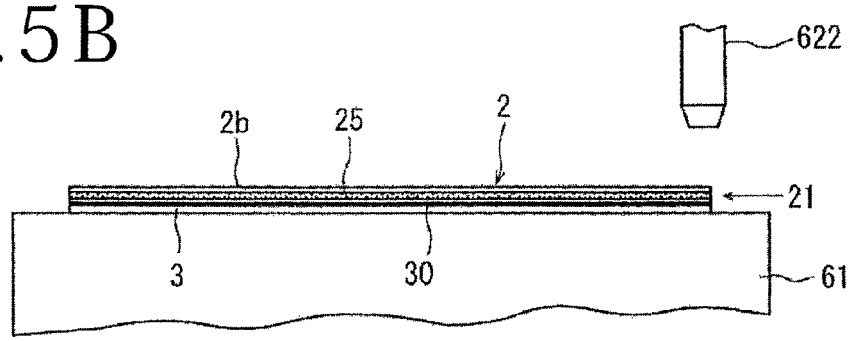

After performing the alignment operation mentioned above to detect all of the division lines 21 of the semiconductor wafer 2 held on the chuck table 61, the chuck table 61 is moved to a laser beam applying area where the focusing means 622 of the laser beam applying means 62 is located as shown in FIG. 5A, thereby positioning one end (left end as viewed in FIG. 5A) of a predetermined one of the division lines 21 extending in the first direction directly below the focusing means 622. Further, the focal point P of the pulsed laser beam to be applied from the focusing means 622 is set at an intermediate position in the direction along the thickness of the semiconductor wafer 2. Thereafter, the pulsed laser beam having a transmission wavelength to the semiconductor wafer 2 (silicon wafer) is applied from the focusing means 622 to the semiconductor wafer 2, and the chuck table 61 is moved at a predetermined feed speed in the direction shown by an arrow X1 in FIG. 5A. When the other end (right end as viewed in FIG. 5B) of the predetermined division line 21 reaches the position directly below the focusing means 622 as shown in FIG. 5B, the application of the pulsed laser beam is stopped and the movement of the chuck table 61 is also stopped. As a result, a modified layer 25 is formed inside the semiconductor wafer 2 along the predetermined division line 21.

For example, the modified layer forming step mentioned above is performed under the following processing conditions.

Light source: YAG pulsed laser
Wavelength: 1064 nm
Repetition frequency: 50 kHz
Average power: 0.5 W
Focused spot diameter: 5 µm
Work feed speed: 300 mm/second After performing the modified layer forming step along the predetermined division line 21 as mentioned above, the chuck table 61 is moved in the indexing direction shown by the arrow Y in FIG. 4 by the pitch of the division lines 21 formed on the semiconductor wafer 2 (indexing step), and the modified layer forming step is similarly performed along the next division line 21 extending in the first direction. In this manner, the modified layer forming step is performed along all of the division lines 21 extending in the first direction. Thereafter, the chuck table 61 is rotated 90 degrees to similarly perform the modified layer forming step along all of the other division lines 21 extending in the second direction perpendicular to the first direction.

Figure 6A:
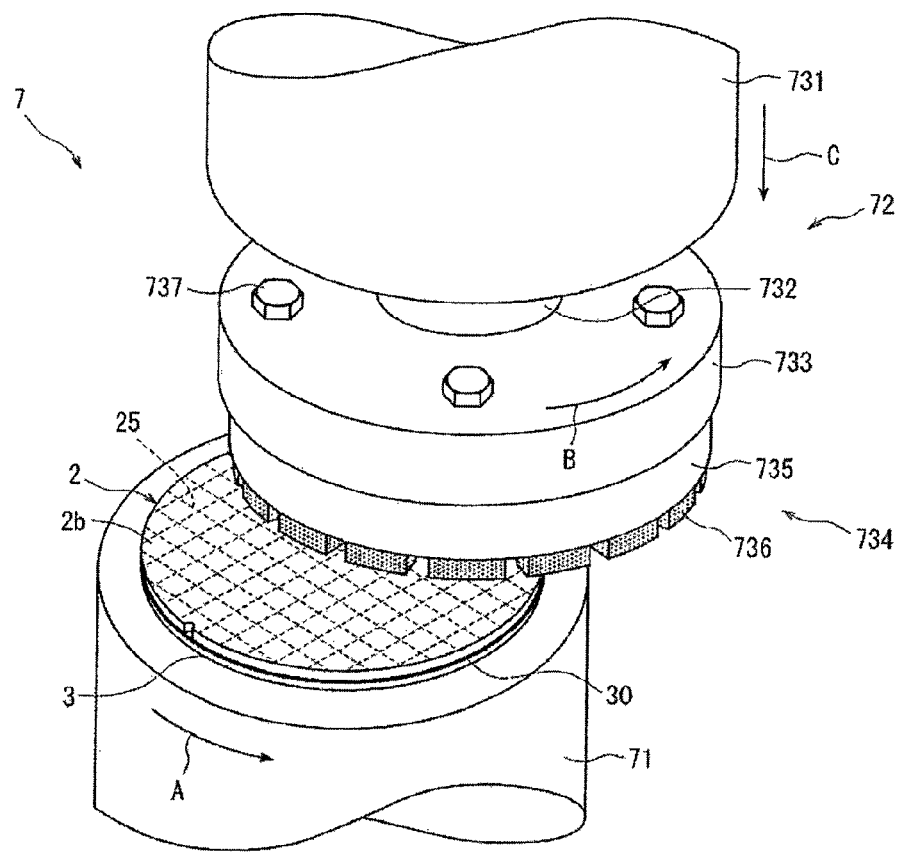
FIGS. 6A and 6B are views for illustrating a back grinding step.

After performing the modified layer forming step mentioned above, a back grinding step is performed in such a manner that the back side 2b of the semiconductor wafer 2 is ground as supplying grinding water to reduce the thickness of the wafer 2 to a predetermined thickness and also divide the semiconductor wafer 2 along each division line 21 where the modified layer 25 is formed as a break start point, thereby obtaining the individual device chips. This back grinding step is performed by using a grinding apparatus 7 shown in FIG. 6A. The grinding apparatus 7 shown in FIG. 6A includes a chuck table 71 for holding a workpiece and grinding means 72 for grinding the workpiece held on the chuck table 71. The chuck table 71 has an upper surface as a holding surface for holding the workpiece under suction. The chuck table 71 is rotatable in the direction shown by an arrow A in FIG. 6A by a rotational drive mechanism (not shown). The grinding means 72 includes a spindle housing 731, a spindle 732 rotatably supported to the spindle housing 731 and adapted to be rotated by a rotational drive mechanism (not shown), a mounter 733 fixed to the lower end of the spindle 732, and a grinding wheel 734 mounted on the lower surface of the mounter 733. The grinding wheel 734 is composed of an annular base 735 and a plurality of abrasive members 736 fixed to the lower surface of the annular base 735 so as to be annularly arranged along the outer circumference thereof. The annular base 735 is mounted on the lower surface of the mounter 733 by a plurality of fastening bolts 737. Although not shown, a grinding water passage is formed in the spindle 732 along the axis thereof, so that grinding water is supplied through the grinding water passage to a grinding area to be ground by the abrasive members 736.

Figure 6B:
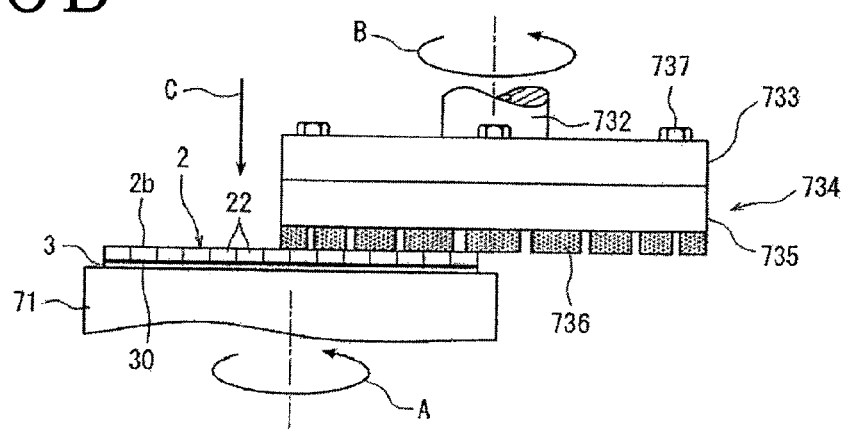

In performing the back grinding step by using the grinding apparatus 7 mentioned above, the semiconductor wafer 2 is placed on the chuck table 71 in the condition where the protective tape 3 attached to the front side 2a of the semiconductor wafer 2 is in contact with the upper surface (holding surface) of the chuck table 71. Thereafter, suction means (not shown) is operated to hold the semiconductor wafer 2 through the protective tape 3 on the chuck table 71 under suction (wafer holding step). Accordingly, the semiconductor wafer 2 is held through the protective tape 3 on the chuck table 71 under suction in the condition where the back side 2b of the semiconductor wafer 2 is oriented upward. After performing this wafer holding step, the chuck table 71 is rotated in the direction of the arrow A in FIG. 6A at 300 rpm, for example. At the same time, the grinding wheel 734 of the grinding means 72 is also rotated in the direction shown by an arrow B in FIG. 6A at 6000 rpm, for example. Thereafter, the grinding means 72 is lowered to bring the abrasive members 736 of the grinding wheel 734 into contact with the back side 2b (work surface) of the semiconductor wafer 2. Thereafter, the grinding wheel 734 is fed (lowered) in the direction shown by an arrow C in FIG. 6B (in the direction perpendicular to the holding surface of the chuck table 71) by a predetermined amount at a feed speed of 1 μm/second, for example. At this time, grinding water is supplied to the grinding area to be ground by the abrasive members 736. By performing this back grinding step, the back side 2b of the semiconductor wafer 2 is ground to reduce the thickness of the semiconductor wafer 2 to a predetermined thickness (e.g., 100 μm). At the same time, the semiconductor wafer 2 is divided along each division line 21 where the modified layer 25 is formed to have a reduced strength, thereby obtaining the individual device chips. These individual device chips are kept in the form of the semiconductor wafer 2 because the protective tape 3 is attached to the front side of these device chips.

As described above, the portion 301 of the adhesive layer 30 in the central area 31 of the protective tape 3 corresponding to the device area 23 of the semiconductor wafer 2 is cured to have a reduced adhesive strength in the adhesive layer curing step. Accordingly, even when the semiconductor wafer 2 is divided into the individual device chips in the back grinding step, the individual device chips are kept in position by the portion 301 of the adhesive layer 30. Accordingly, there is no possibility that the individual device chips may come into contact with each other to cause the chipping of the side surfaces of the device chips. Further, the portion 302 of the adhesive layer 30 in the peripheral area 32 of the protective tape 3 corresponding to the peripheral marginal area 24 of the semiconductor wafer 2 is not cured to maintain its adhesive strength in the adhesive layer curing step. Accordingly, the portion 302 of the adhesive layer 30 tightly adheres to the front side 2a of the semiconductor wafer 2, so that there is no possibility that chipping may occur at the outer circumference of the semiconductor wafer 2 and the front side 2a of the semiconductor wafer 2 may be contaminated.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer processing method for dividing a wafer into a plurality of individual device chips along division lines, said division lines being formed on a front side of said wafer to thereby define a plurality of separate regions where a plurality of devices corresponding to said individual device chips are formed, the front side of said wafer being composed of a device area where said devices are formed and a peripheral marginal area surrounding said device area, said wafer processing method comprising:

a protective tape attaching step of attaching a protective tape to the front side of said wafer, said protective tape having an adhesive layer curable by the application of ultraviolet light;

an adhesive layer curing step of applying ultraviolet light to said protective tape attached to the front side of said wafer to thereby cure said adhesive layer;

a modified layer forming step of applying a laser beam having a transmission wavelength to said wafer along each division line in a condition where the focal point of said laser beam is set inside said wafer to thereby form a modified layer inside said wafer along each division line; and a back grinding step of grinding a back side of said wafer as supplying grinding water to reduce the thickness of said wafer to a predetermined thickness and also divide said wafer along each division line where said modified layer is formed as a break start point, thereby obtaining said individual device chips after performing said adhesive layer curing step and said modified layer forming step.

2. The wafer processing method according to claim 1, wherein said adhesive layer curing step comprises the step of applying ultraviolet light to only a central area of said protective tape corresponding to said device area of said wafer, thereby curing only a portion of said adhesive layer in said central area of said protective tape corresponding to said device area of said wafer.

* * * * *